Figure 1:
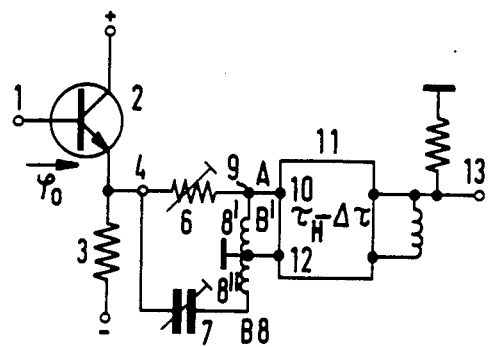

United States Patent [19]
Hess et al.

[11] Patent Number: 4,679,064
[45] Date of Patent: Jul. 7, 1987

[54] CIRCUIT FOR CHANGEABLE PROLONGATION OF THE RUNNING TIME OF AN ULTRASOUND DELAY LINE

[75] Inventors: Heinz Hess, Weiterstadt; Horst Peth, Alsbach-Hähnlein, both of Fed. Rep. of Germany

[73] Assignee: Robert Bosch GmbH, Stuttgart, Fed. Rep. of Germany

[21] Appl. No.: 765,433

[22] PCT Filed: Mar. 4, 1985

[86] PCT No.: PCT/DE85/00067
§ 371 Date: Jul. 18, 1985
§ 102(e) Date: Jul. 18, 1985

[87] PCT Pub. No.: WO85/04303
PCT Pub. Date: Sep. 26, 1985

[30] Foreign Application Priority Data
Mar. 10, 1984 [DE] Fed. Rep. of Germany ....... 3408821

[51] Int. Cl.$^4$ ............................................. H04N 9/66
[52] U.S. Cl. ....................................... 358/24; 358/23; 307/262
[58] Field of Search ............... 358/24, 31, 21 R, 23; 333/144; 307/262; 328/56

[56] References Cited
U.S. PATENT DOCUMENTS
3,433,780 3/1969 Swaluw .......................... 358/24 X
3,446,913 5/1969 Scholz ................................ 358/24
3,745,239 7/1973 Renaud ................................ 358/24

FOREIGN PATENT DOCUMENTS
1281485 10/1968 Fed. Rep. of Germany.
1762660 1/1971 Fed. Rep. of Germany.
1126526 9/1968 United Kingdom ................. 358/24

OTHER PUBLICATIONS
"Demodulation Circuits for PAL Colour T.V. Receivers", Bruch, *Electronic Engineering*, Aug. 64, pp. 512–518, 606–611.

*Primary Examiner*—James J. Groody
*Assistant Examiner*—Victor R. Kostak
*Attorney, Agent, or Firm*—Michael J. Striker

[57] ABSTRACT

A circuit for the changeable prolongation of the (phase-) running time of an ultrasound delay line with a delay duration of somewhat less than a line duration for color television signals in the range of the color carrier frequency includes a changeable resistor which is disposed in the signal path and connected to the first input of the ultrasound delay line; a coil which is disposed between the first input of the delay line and the second input which is connected with the reference potential. The coil represents a first winding (8') of a transformer (8), whose second winding (8") is applied at one end thereof on the reference potential, and is connected through a changeable capacity (7) with the connection point of the changeable resistor (6) and an input terminal of a signal to be delayed.

5 Claims, 3 Drawing Figures

CIRCUIT FOR CHANGEABLE PROLONGATION OF THE RUNNING TIME OF AN ULTRASOUND DELAY LINE

STATE OF THE ART

The invention is based on a circuit for an adjustable prolongation of a (phase-) running time of an ultrasound delay line having a delay of somewhat less than a line duration of color TV signal in the range of the color carrier frequency.

Price efficient ultrasound delay lines as used, for example, in the PAL-running time-decoder for signal dividing in color television receivers, delay the supplied signal by one line period $\tau_H$ by ¼ of a color carrier period (64 us–56 ns). If such ultrasound delay lines should be used also for circuits, wherein one delay duration of exactly one line duration $\tau_H$ is required (for example, comb filter, signal drop out-compensator), then passive delay members for prolonging the running time could be used. However, this is very expensive.

It is therefore an object of the invention to provide a circuit of the aforementioned type with which a delay duration of exactly one line duration is obtainable without additional delay members.

ADVANTAGES OF THE INVENTION

The circuit in accordance with the invention with the characterizing features of the main claim has the advantage that price efficient ultrasound delay lines may be used without any great additional effort for generating a delay time of exactly one line duration.

Advantageous further embodiments and improvements of the circuit stated in the main claim are possible by the measures stated in the subclaims. It is particularly advantageous that an automatic phase adjustment is possible when a phase detector and, for exaample, a capacity-variation diode.

DRAWING

Figure 1A:
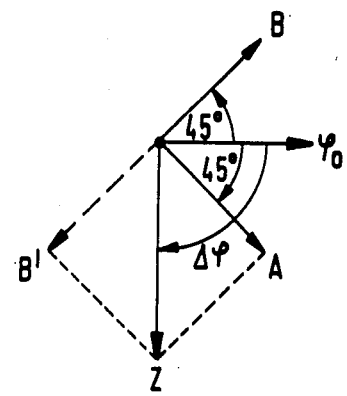

Exemplified embodiments of the invention are illustrated and are explained in detail in the following description. The drawings show:

FIG. 1 A circuit in accordance with the invention,

FIG. 1a a vector diagram of the signal phases occurring in FIG. 1

Figure 2:
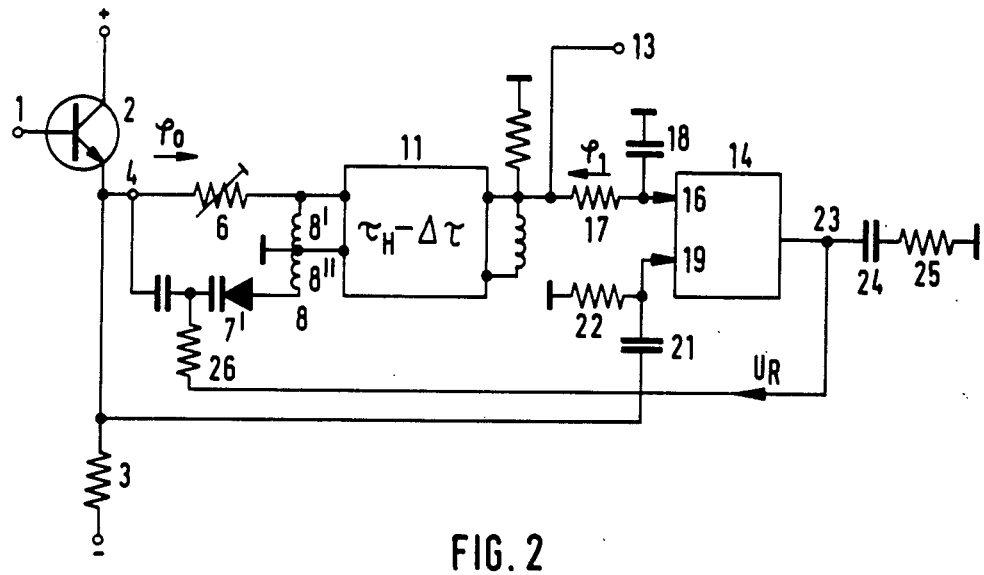

FIG. 2 A circuit in accordance with the invention with phase readjustment

In the circuit illustrated in FIG. 1, a television signal with an input phase $\phi_0$ (see also FIG. 1a) to be delayed in the color carrier frequency is applied on terminal 1. After transmission through a transistor impedance converter stage 2,3 this signal is applied to output 4. A phase rotating circuit which consists of a changeable resistor 6, a changeable capacitor 7 as well as a centrally tapped transformer 8 with a first winding 8' is connected to the output 4 and a second winding 8". The connecting point 9 between resistor 6 and the transformer 8 is connected with the first input 10 of an ultrasound delay line 11, whose second input 12 is applied on the reference potential. This ultrasound delay line 11 represents a delay line for the signal dividing with a delay time of $\tau = 63,944$ us–56 ns) as customary in PAL-running time-decoders.

The phase rotating circuit effects with $|X_C| = R$ in the color carrier frequency a rotating of the input phase $\phi_0$ by the RC-combination 6/7 by $-45°$ (vector A) and by the CR-combination 7/6 by $+45°$ (vector B). Due to the inverting characteristic of the center tapped transformer 8, the vector B appears as being rotated at point 9 by 180° (vector B'), so that a resulting vector Z is obtained at the input of the ultrasound delay line 11. This vector Z is phase rotated by $\phi_0$ by $\Delta\phi = 90°$ with respect to the input phase angle of the vector which angle corresponds to a quarter of a color carrier period or 56 ns. Thus, the phase or running time of the signal to be picked off at the output 13 of the ultrasound delay line 11 corresponds exactly one line duration ($\tau = 64$ us.) By adjusting the resistor 6 or the capacitor 7 the phase shift can be adjusted. Instead of the passive phase determining elements 6 and 7, voltage controlled elements may be used, for example, instead of resistor 6 a field effect transistor, or, instead of the capacitor 7 a capacity variation diode, whereby the total running time can be maintained constant in an automatic control circuit.

FIG. 2 illustrates such an automatic control circuit, whereby the elements already mentioned in FIG. 1 are provided with the same reference numerals. A phase detector 14 is provided for stabilising the running time of the signal to be picked up at the output 13. The signal emitted at the output of delay line H, for the NTSC color carrier is fed through a RC-member 17,18 to the first input 16 of the phase detector 14 and at the second input 19 of which the signal is applied which is delivered at the output 4 of the transistor stage 2,3 and, for the NTSC color carrier is fed through a CR-member 21,22. The output 23 of the phase detector 14 is connected via a PI-member 24,25 to ground, and control voltage UR through a resistor is applied 26 to a capacity-variation diode or varactor 7' for changing its capacity.

When delaying the input signal which is applied on point 4 with an input phase $\phi_0$ by exactly one line duration $\tau_H$ an output signal with an output phase $\phi_1$ is generated on output 13, which appears to be rotated by 180° in the NTSC color carrier and by 90° in the PAL-color carrier with respect to the input phase $\phi_0$. In a dimensioning of $|X_C| = R$ (of the members 7' and 6) in the color carrier frequency signals are fed to the inputs 16 and 19 of the phase detector 14, in the NTSC color carrier also through the phase rotating members 17,18 and 21,22, which show a phase displacement by 90° toward each other in the NTSC color carrier and no displacement in the PAL color carrier. The control voltage UR=zero (build up state) is the result of this relation at the output 23 of the phase detector 14. When deviating from this build up state a control voltage $U_R$ differing from zero is generated and corrects the phase by means of the set member 7', for example.

We claim:

1. Circuit for a changeable prolongation of the (phase-) running time of an ultrasound delay line with a delay duration of somewhat less than a line duration for color television signals in the range of the color carrier frequency, comprising a source of a signal to be processed, a changeable resistor which is connected between said source and a first input of the ultrasound delay line; a coil which is disposed between the first input and a second input of the delay line, said second input being connected to a reference potential; the coil being a first winding (8') of a transformer, (8), said transformer having a second winding (8") connected at one end thereof to the reference potential and, at the other end thereof, through a changeable capacity (7) to a connection point of the changeable resistor (6) and the signal source.

2. Circuit in accordance with claim 1, wherein the transformer consists of a centrally tapped coil, whose tapping is applied on the reference potential.

3. Circuit in accordance with claim 1, wherein the changeable capacity (7) is a varactor (7').

4. Circuit for stabilizing the adjusted (phase-) running time of an ultrasound delay circuit in accordance with claim 1, comprising a phase detector (14) having two inputs and an output, one of said inputs being coupled to an output (13) of the ultrasound delay line (11), and said output of the detector delivering an output voltage ($U_R$) for controlling the changeable resistor (6) or the changeable capacity (7).

5. Circuit in accordance with claim 4, wherein for the NTSC-color carrier the one input (16) of the phase detector (14) is connected through an RC-member (17, 18) to the output (13) of the ultrasound delay line (11), and the other input (19) of the phase detector through a CR-member (21, 22) to the connection of the changeable resistor (6) with the signal source.

* * * * *